(12) United States Patent
Shon et al.

(10) Patent No.: US 7,225,934 B2
(45) Date of Patent: Jun. 5, 2007

(54) CASSETTE FOR RECEIVING GLASS SUBSTRATES

(75) Inventors: Houng Suk Shon, Kyoungki-do (KR); Tai Sung Choi, Kyoungki-do (KR)

(73) Assignee: Boe Hydis Technology Co., Ltd., Kyoungki-do (KR)

(*) Notice: Subject to any disclaimer, the term of this patent is extended or adjusted under 35 U.S.C. 154(b) by 397 days.

(21) Appl. No.: 10/834,614

(22) Filed: Apr. 29, 2004

(65) Prior Publication Data

US 2004/0200788 A1 Oct. 14, 2004

(30) Foreign Application Priority Data

Jul. 4, 2003 (KR) ........................ 10-2003-0045249

(51) Int. Cl.
*A47G 19/08* (2006.01)
(52) U.S. Cl. .................................................. 211/41.18
(58) Field of Classification Search ............. 211/41.18, 211/41.1, 41.12, 41.14, 41.17
See application file for complete search history.

(56) References Cited

U.S. PATENT DOCUMENTS 4,228,902 A * 10/1980 Schulte ................... 211/41.18
5,853,214 A * 12/1998 Babbs et al. ................. 294/161
5,960,960 A * 10/1999 Yamamoto ................... 206/711
6,092,981 A * 7/2000 Pfeiffer et al. .............. 414/810
6,617,540 B2 * 9/2003 Zehavi ................... 219/121.64

FOREIGN PATENT DOCUMENTS

KR 19990080028 11/1999

* cited by examiner

*Primary Examiner*—Sarah Purol
(74) *Attorney, Agent, or Firm*—Ladas & Parry LLP

(57) ABSTRACT

Disclosed is a cassette for receiving glass substrates therein. The cassette includes lower and upper rectangular plates, support bars vertically installed between the lower and upper rectangular plates and having a plurality of first gap maintenance rings aligned lengthwise along the support bars, and glass substrate stoppers vertically located between the lower and upper rectangular plates at positions corresponding to both longitudinal sides of the lower and upper rectangular plates. The glass substrate stoppers have second gap maintenance rings aligned lengthwise along the glass substrate stoppers while forming a uniform interval therebetween. The glass substrates are prevented from being broken caused by a collision of the glass substrates against an unloading robot, so a yield rate of thin film transistor liquid crystal display devices is improved.

4 Claims, 6 Drawing Sheets

CASSETTE FOR RECEIVING GLASS SUBSTRATES

BACKGROUND OF THE INVENTION

1. Field of the Invention

The present invention relates to a cassette for receiving glass substrates, and more particularly to a cassette for receiving glass substrates, capable of preventing the glass substrates from being damaged even if a distance between the glass substrates becomes small.

2. Description of the Prior Art

As is generally known in the art, cassettes for receiving substrates have been used in semiconductor manufacturing processes and flat panel display manufacturing processes. Among those cassettes, a cassette used in the flat panel display manufacturing process receives a plurality of glass substrates therein in order to load/unload the glass substrate on/from manufacturing equipment. That is, the cassette is used as a transferring device for the glass substrates received therein.

FIG. 1 is a perspective view showing a conventional cassette for receiving glass substrates. As shown in FIG. 1, the conventional cassette 10 includes a lower rectangular plate 12, an upper rectangular plate 14, and a plurality of support bars 16 vertically aligned between the lower and upper rectangular plates 12 and 14. The lower and upper rectangular plates 12 and 14 have a cross-shaped frame therein. The support bars 16 are positioned corresponding to edges and middle portions of both longitudinal sides of the lower and upper rectangular plates 12 and 14. Particularly, the support bars 16 include a plurality of gap maintenance rings 18, which are aligned lengthwise along the support bars 16 in order to ensure a sufficient distance between glass substrates 1.

Herein, each of the gap maintenance rings 18 has a thickness of about 2 mm, and the distance between the glass substrates 1 is about 1 cm.

A thin film transistor liquid crystal display device including an array substrate and a color filter substrate is fabricated through a lithography process. In particular, the array substrate must be fabricated through the lithography process. That is, when fabricating the array substrate, photoresist is firstly coated on an etch layer and a photoresist pattern is formed by performing exposure and development processes with respect to the photoresist. Then, the etch layer is etched to have a predetermined pattern by using the photoresist pattern. Then, the photoresist pattern is removed from the etch layer.

Herein, when a wet-etching process is carried out with respect to the etch layer or when the photoresist pattern is removed from the etch layer, a plurality of glass substrates (for example, 24 glass substrates) are received in a cassette and the cassette receiving the glass substrates is immersed in a bath having chemicals or cleaning solution therein for a predetermined period of time in such a manner that all glass substrates are simultaneously subject to the etching process or the photoresist pattern removing process.

However, when the size of manufacturing equipment is reduced, that is, when the size of the chemical bath is reduced, it is necessary to reduce the size of the cassette receiving the glass substrates. Herein, if the size of the cassette becomes reduced, the glass substrates must be aligned in the cassette while forming a narrower interval therebetween. In this case, as shown in FIG. 2, although the size of the cassette becomes reduced, a flow of chemicals 22 or cleaning solution may be disturbed by the glass substrates 1 when performing the wet etching process, so an optimum process condition cannot be achieved. In addition, as shown in FIG. 3, since the glass substrates 1 having thin thickness may be bent during the wet etching process, a glass substrate makes contact with an adjacent glass substrate, causing scratches or dry faults to the glass substrates 1. In addition, while the glass substrates 1 are being unloaded from manufacturing equipment after the manufacturing process has been finished, the glass substrates 1 may collide with an unloading robot 30, so that the glass substrates 1 may be broken.

Reference numeral 20 shown in FIG. 2 represents a chemical bath.

SUMMARY OF THE INVENTION

Accordingly, the present invention has been made to solve the above-mentioned problems occurring in the prior art, and an object of the present invention is to provide a cassette for receiving glass substrates, capable of preventing the glass substrates from being damaged even if a distance between the glass substrates becomes small.

In order to accomplish this object, there is provided a cassette for receiving glass substrates therein, the cassette comprising: lower and upper rectangular plates spaced from each other by a predetermined distance; support bars vertically installed between the lower and upper rectangular plates corresponding to edges and middle portions of both longitudinal sides of the lower and upper rectangular plates and having a plurality of first gap maintenance rings, which are aligned lengthwise along the support bars; and glass substrate stoppers vertically located between the lower and upper rectangular plates at positions corresponding to both longitudinal sides of the lower and upper rectangular plates in such a manner that the lower and upper plates are linearly moved up and down along the glass substrate stoppers by means of elastic force of springs, and having second gap maintenance rings aligned lengthwise along the glass substrate stoppers while forming a uniform interval in order to prevent the glass substrates inserted between the first gap maintenance rings of the support bars from being moved by pressing the glass substrates.

According to the preferred embodiment of the present invention, a lower end of the glass substrate stopper downwardly extends by a predetermined distance while passing through the lower rectangular plate and a compression spring is interposed between the lower rectangular plate and the lower end of the glass substrate stopper in order to apply bias force towards the lower rectangular plate. The lower and upper rectangular plates are moved down along the glass substrate stopper when the glass substrates are loaded/unload in/from the cassette, and moved up along the glass substrate stopper when the cassette is conveyed, thereby fixedly pressing the glass substrates.

According to the preferred embodiment of the present invention, the glass substrate stopper is additionally provided to fixedly press the glass substrates inserted between the first gap maintenance rings of the support bars, so the distance between the glass substrates can be uniformly maintained, thereby allowing chemicals or cleaning solution to stably flow. In addition, the glass substrates are prevented from making contact with each other, the present invention does not cause scratches or dry faults to the glass substrates. Particularly, the glass substrates can be prevented from being broken by a collision of the glass substrates against an unloading robot.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
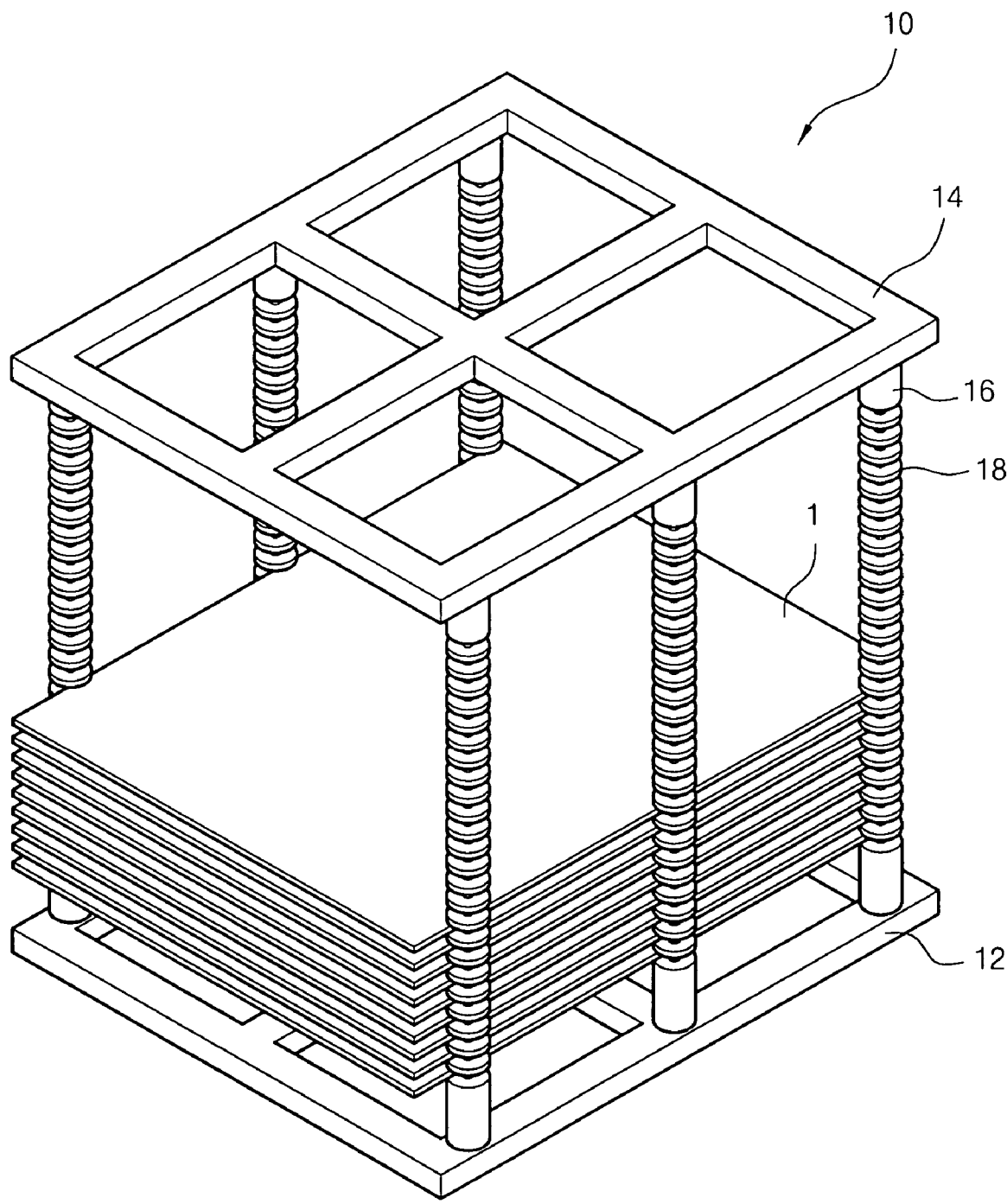
FIG. 1 is a perspective view showing a conventional cassette for receiving glass substrates.
Figure 2:
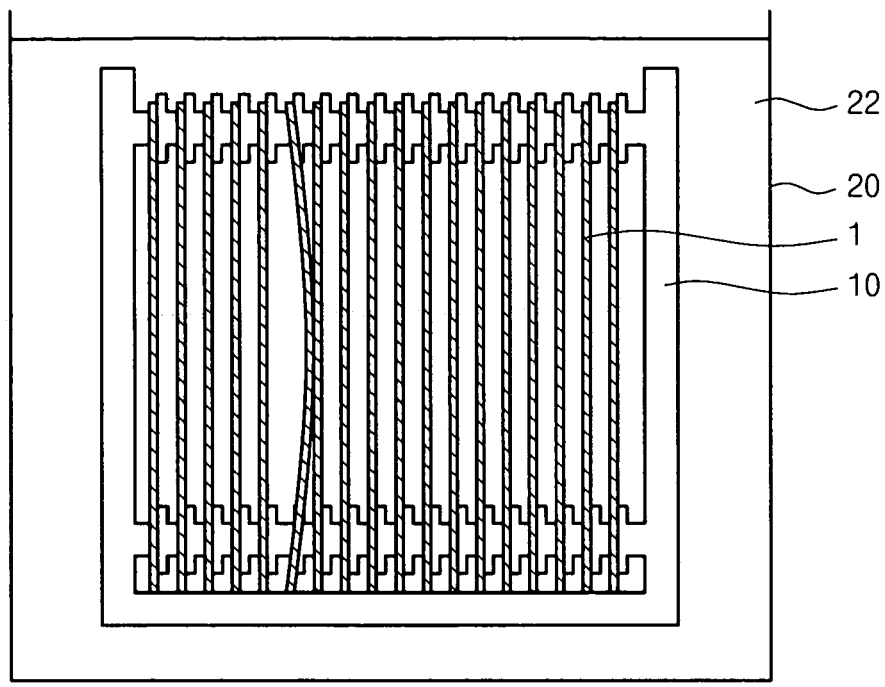
FIGS. 2 and 3 are views showing problems of a conventional cassette for receiving glass substrates.
Figure 3:
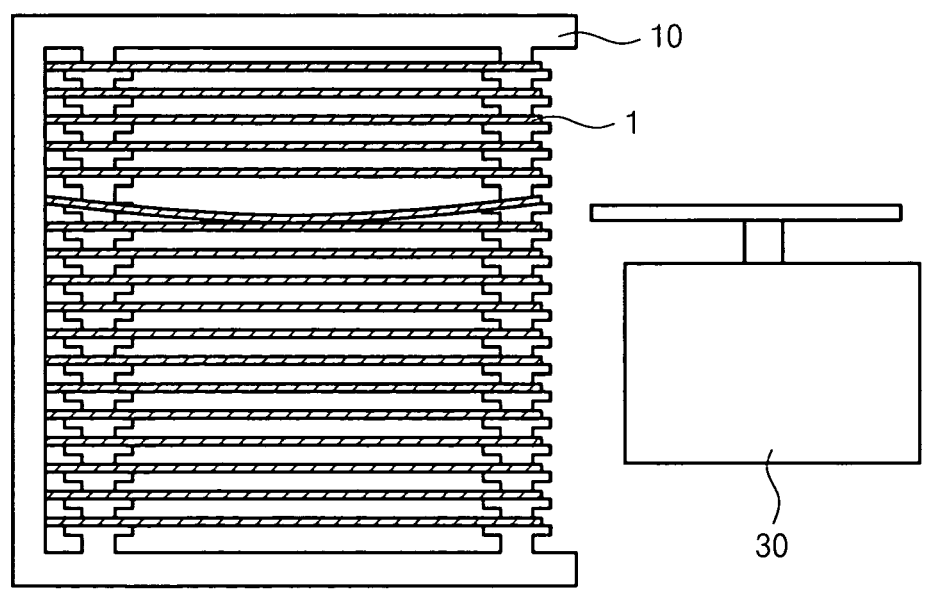

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 4:
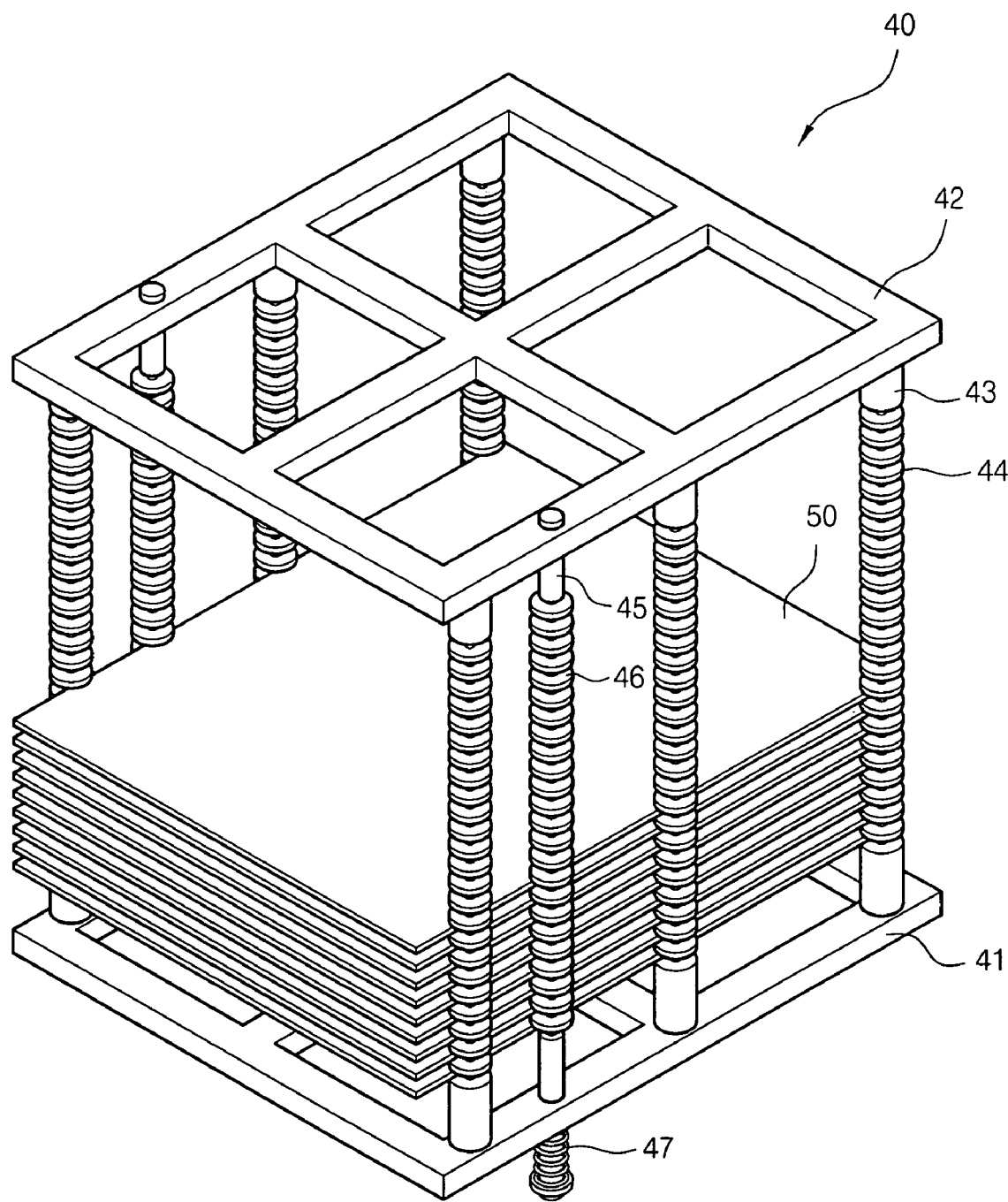
FIG. 4 is a perspective view showing a cassette for receiving glass substrates according to one embodiment of the present invention.
Figure 5A:
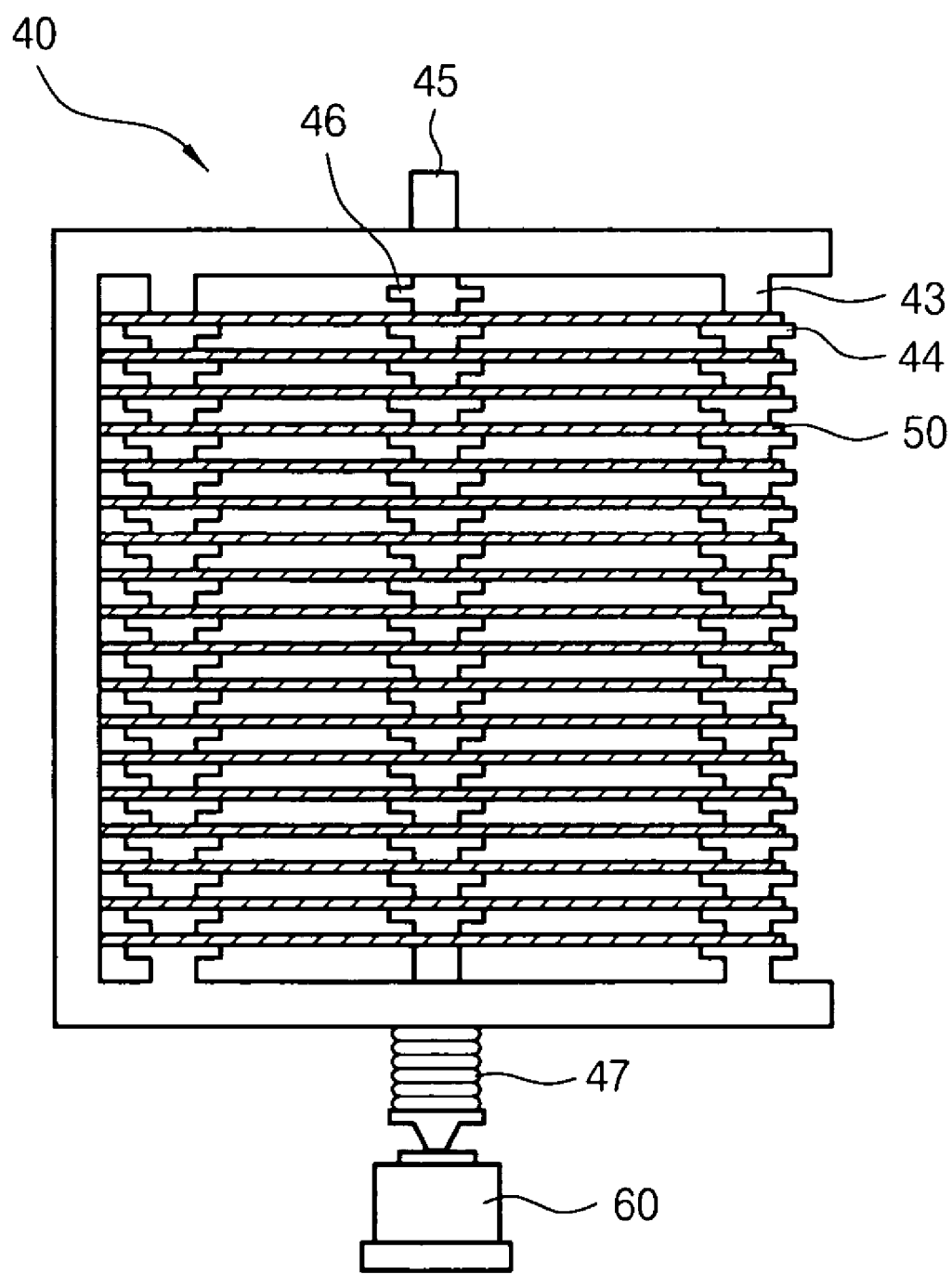
FIGS. 5A and 5B are views showing an operation of a glass substrate stopper provided in a cassette for receiving glass substrates according to one embodiment of the present invention.
Figure 5B:
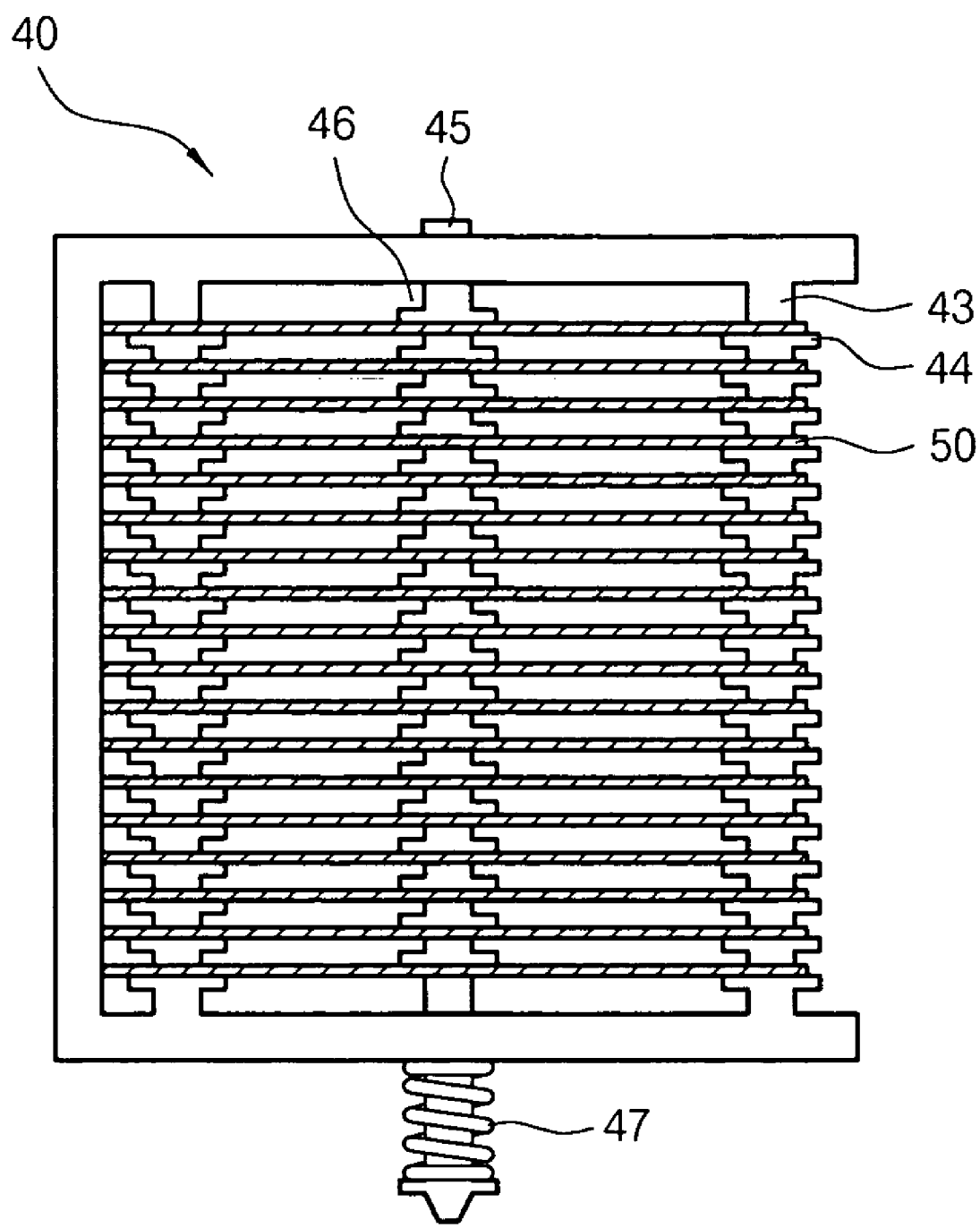
Figure 6:
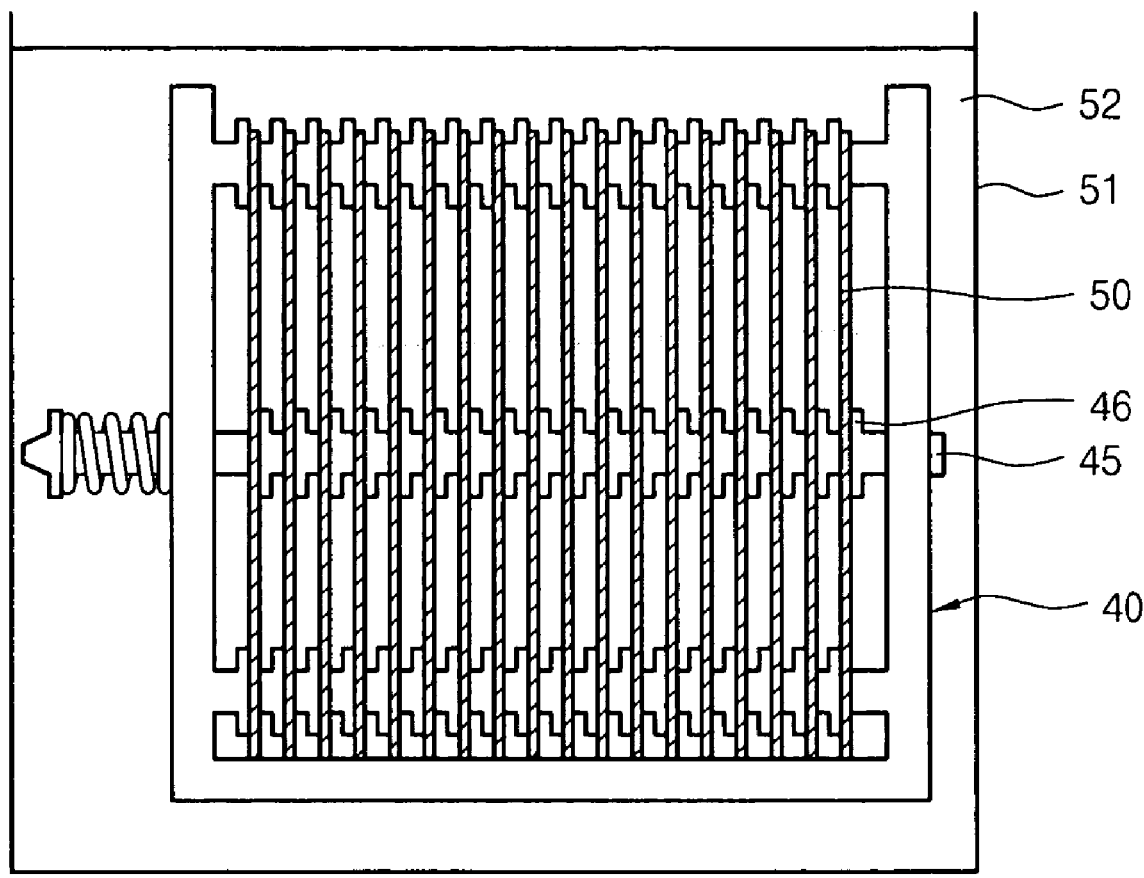
FIG. 6 is a view showing a cassette receiving glass substrates immersed in a bath according to one embodiment of the present invention.

FIG. 4 is a perspective view showing a cassette for receiving glass substrates according to one embodiment of the present invention, FIGS. 5A and 5B are views showing an operation of a glass substrate stopper provided in the cassette for receiving glass substrates according to one embodiment of the present invention, and FIG. 6 is a view showing the cassette receiving glass substrates immersed in a bath according to one embodiment of the present invention.

Referring to FIG. 4, a cassette 40 for receiving glass substrates includes a lower rectangular plate 41, an upper rectangular plate 42, and a plurality of support bars 43 aligned between the lower and upper rectangular plates 41 and 42. The lower and upper rectangular plates 41 and 42 have a cross-shaped frame therein. The support bars 43 are positioned corresponding to edges and middle portions of both longitudinal sides of the lower and upper rectangular plates 41 and 42. Particularly, the support bars 43 include a plurality of first gap maintenance rings 44, which are aligned lengthwise along the support bars 43 in order to ensure a sufficient distance between glass substrates 50.

As compared with the conventional cassette 10 for receiving glass substrates, the cassette 40 of the present invention additionally includes glass substrate stoppers 45, which are vertically located between the lower and upper rectangular plates 41 and 42 at positions corresponding to both longitudinal sides of the lower and upper rectangular plates 41 and 42.

Similar to the support bars 43, each of the glass substrate stoppers 45 has second gap maintenance rings 46, which are aligned lengthwise along the glass substrate stoppers 45. Particularly, the lower and upper rectangular plates 41 and 42 can linearly move up and down along the glass substrate stopper 45. To this end, a lower end of the glass substrate stopper 45 downwardly extends by passing though the lower rectangular plate 41. In addition, a tension member, preferably a compression spring 47, is installed between the lower end of the glass substrate stopper 45 and the lower rectangular plate 41. Accordingly, the lower and upper rectangular plates 41 and 42 are linearly moved down along the glass substrate stopper 45 due to a tare thereof and/or weight of glass substrates, and moved up by means of elastic force of the compression spring 47.

Hereinafter, an operation of the cassette for receiving glass substrates according to the present invention will be described.

When the glass substrates have not been loaded in the cassette 40, the lower and upper rectangular plate 41 and 42 are upwardly biased by means of the compression spring 47. In this state, as shown in FIG. 5A, if the cassette 40 is mounted on a bracket 60, the lower and upper rectangular plates 41 and 42 are downwardly moved along the glass substrate stopper 45 due to a tare thereof. Herein, the lower end of the glass substrate stopper 45 makes contact with an upper surface of the bracket 60.

In this state, the glass substrates 50 are loaded in the cassette 40, in such a manner that glass substrates 50 are inserted between the first gap maintenance rings 44 of the support bars 43 and between the second gap maintenance rings 46 of the glass substrate stopper 45.

Referring to FIG. 5B, when the cassette 40 receiving the glass substrates 50 is moved from the bracket 60, the lower and upper rectangular plates 41 and 42 are upwardly moved along the glass substrate stopper 45 by means of elastic force of the compression spring 47. Since the glass substrates 50 have been inserted between the second gap maintenance rings 46, the glass substrates 50 are fixedly maintained by means of the second gap maintenance rings 46.

Therefore, as shown In FIG. 6, when the cassette 40 receiving a plurality of glass substrates 50 is immersed in chemicals 52 contained in a bath 51, the first gap maintenance rings 44 of the support bars 43 and the second gap maintenance rings 46 of the glass substrate stopper 45 may uniformly maintain a distance between the glass substrates 50, so chemicals 52 can stably flow through the glass substrates 50. In addition, a dry fault may not occur in the next dry process.

After that, although it is not illustrated, the cassette 40 is again mounted on the bracket 60 in order to unload the glass substrates 50. That is, when the cassette 40 is mounted on the bracket 60, the lower and upper rectangular plates 41 and 42 are downwardly moved along the glass substrate stopper 45 due to weight of the glass substrates 50 and the tare thereof. Accordingly, the glass substrates 50 can be easily unloaded from the cassette 40. Particularly, since the glass substrates 50 are prevented from bending, a sufficient distance can be ensured between the glass substrates 50 (about 8 mm in maximum), so the glass substrates 50 can be prevented from being broken caused by a collision of the glass substrates against an unloading robot.

As described above, according to the present invention, the glass substrate stopper is additionally provided to fixedly press the glass substrates inserted between first gap maintenance rings of the support bars, so the distance between the glass substrates can be uniformly maintained, thereby allowing chemicals or cleaning solution to stably flow. Thus, the present invention does not cause scratches or dry faults to the glass substrates. Particularly, the glass substrates can be prevented from being broken caused by a collision of the glass substrates against an unloading robot, so a yield rate of thin film transistor liquid crystal display devices can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A cassette for receiving glass substrates therein, the cassette comprising:
   lower and upper rectangular plates spaced from each other by a predetermined distance;
   support bars vertically installed between the lower and upper rectangular plates corresponding to edges and middle portions of both longitudinal sides of the lower and upper rectangular plates and having a plurality of first gap maintenance rings, which are aligned lengthwise along the support bars; and
   glass substrate stoppers vertically located between the lower and upper rectangular plates at positions corresponding to both longitudinal sides of the lower and upper rectangular plates in such a manner that the lower and upper plates are linearly movable up and down along the glass substrate stoppers, and each glass substrate stopper having second gap maintenance rings aligned lengthwise along the glass substrate stoppers while forming a uniform interval therebetween in order to prevent the glass substrates inserted between the first gap maintenance rings of the support bars from being moved by pressing the glass substrates by elastic force of springs.

2. The cassette as claimed in claim 1, wherein a lower end of the glass substrate stopper downwardly extends by a predetermined distance while passing through the lower rectangular plate.

3. The cassette as claimed in claim 2, wherein a compression spring is interposed between the lower rectangular plate and the lower end of the glass substrate stopper in order to apply bias force towards the lower rectangular plate.

4. The cassette as claimed in claim 1, wherein the lower and upper rectangular plates are moved down along the glass substrate stopper when the glass substrates are loaded/unload in/from the cassette, and moved up along the glass substrate stopper when the cassette is conveyed, thereby fixedly pressing the glass substrates.

* * * * *